United States Patent
Sakurai et al.

(10) Patent No.: US 8,017,287 B2
(45) Date of Patent: Sep. 13, 2011

(54) DEVELOPMENT METHOD, METHOD OF MANUFACTURING PHOTOMASK, AND METHOD OF MANUFACTURING SEMICONDUCTOR DEVICE

(75) Inventors: Hideaki Sakurai, Kanagawa (JP); Masatoshi Terayama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 12/559,735

(22) Filed: Sep. 15, 2009

(65) Prior Publication Data
US 2010/0129737 A1    May 27, 2010

(30) Foreign Application Priority Data

Nov. 25, 2008  (JP) ................................ 2008-299584

(51) Int. Cl.
G03F 1/00   (2006.01)
G03F 7/30   (2006.01)
G03F 7/40   (2006.01)

(52) U.S. Cl. .............................. 430/5; 430/30; 430/311
(58) Field of Classification Search .................... 430/30, 430/5, 311
See application file for complete search history.

(56) References Cited

U.S. PATENT DOCUMENTS

| | | |
|---|---|---|
| 6,550,990 B2 | 4/2003 | Sakurai et al. |
| 6,929,903 B2 | 8/2005 | Itoh et al. |
| 7,001,086 B2 | 2/2006 | Itoh et al. |
| 7,094,522 B2 | 8/2006 | Itoh et al. |
| 7,390,365 B2 | 6/2008 | Itoh et al. |
| 2004/0106072 A1 | 6/2004 | Itoh et al. |
| 2005/0079639 A1 | 4/2005 | Itoh et al. |
| 2005/0081996 A1 | 4/2005 | Itoh et al. |

FOREIGN PATENT DOCUMENTS

JP   2005-217254   8/2005

OTHER PUBLICATIONS

Sakurai, "Substrate Processing Method and Mask Manufacturing Method", U.S. Appl. No. 12/479,202, filed Jun. 5, 2009.

*Primary Examiner* — Mark F Huff
*Assistant Examiner* — John Ruggles
(74) *Attorney, Agent, or Firm* — Finnegan, Henderson, Farabow, Garrett & Dunner, L.L.P.

(57) ABSTRACT

A development method according to an embodiment includes exposing a photosensitive film formed on a substrate at a predetermined exposure amount, carrying out a first development process that develops the exposed photosensitive film at a predetermined first development condition so as to leave the photosensitive film, obtaining a sensitivity information of an unexposed photosensitive film on the substrate from a film thickness reduction of the photosensitive film developed by the first development process and the predetermined exposure amount, predicting pattern dimensions of multiple types of patterns to be formed when a second development process is carried out following the first development process from the sensitivity information, and determining a first acceptable range of a development condition in the second development process, determining a second acceptable range of the development condition in the second development process from the first acceptable range and a variation amount of pattern dimensions between the multiple types of patterns after the second development process and determining a second development condition in the second development process so as to satisfy both of the first and second acceptable ranges. The development method is used for forming a mask pattern on a photomask, which is then used for patterning a wafer in the manufacturing of a semiconductor device.

19 Claims, 12 Drawing Sheets

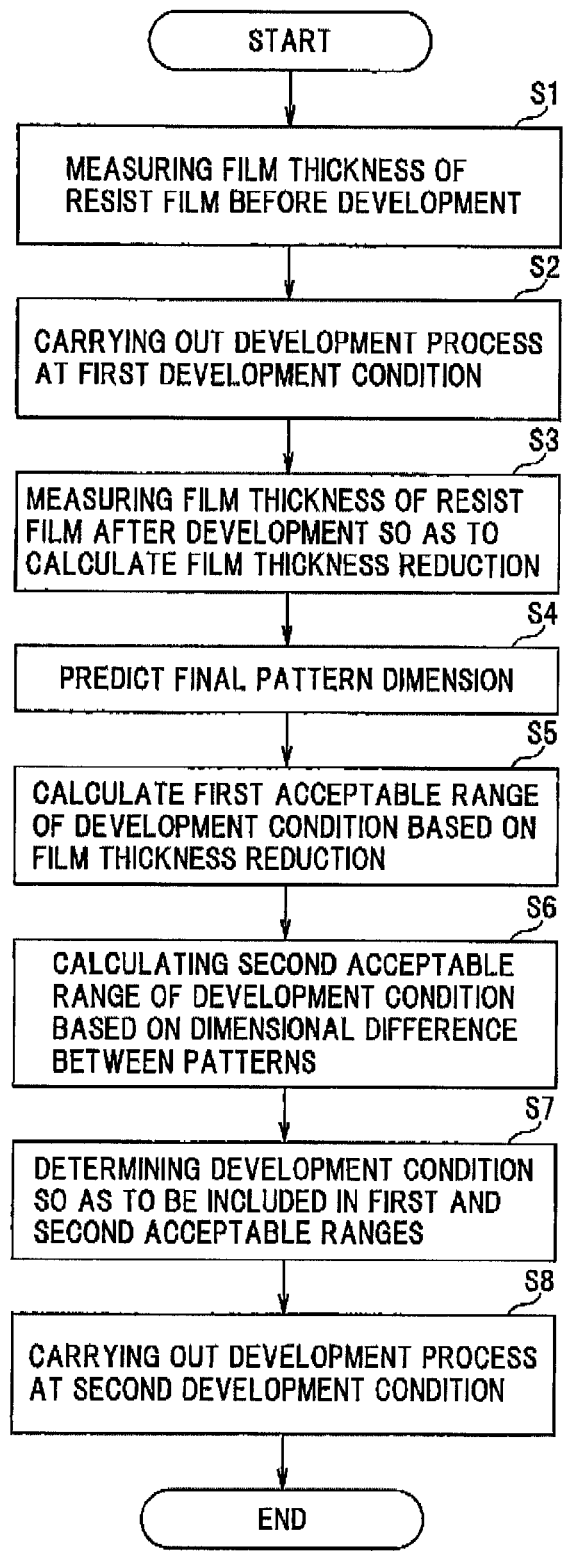

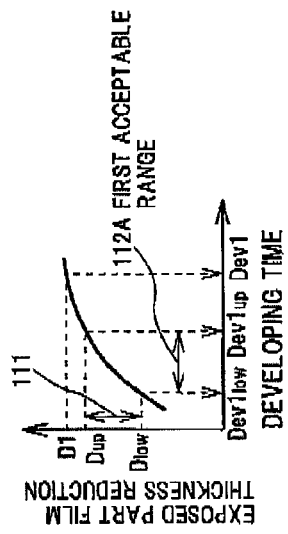
FIG.3A
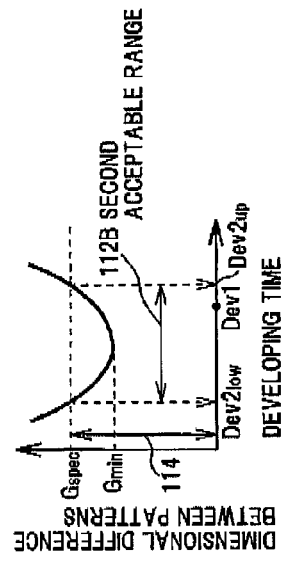
FIG.3B
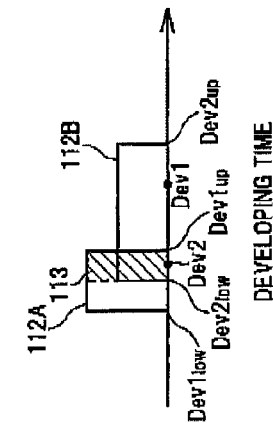
FIG.3C
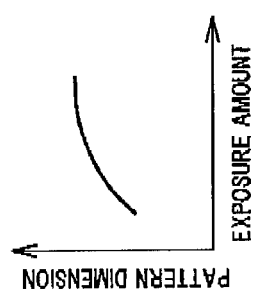
FIG.3D
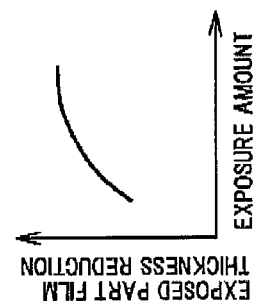
FIG.3E
FIG.3F

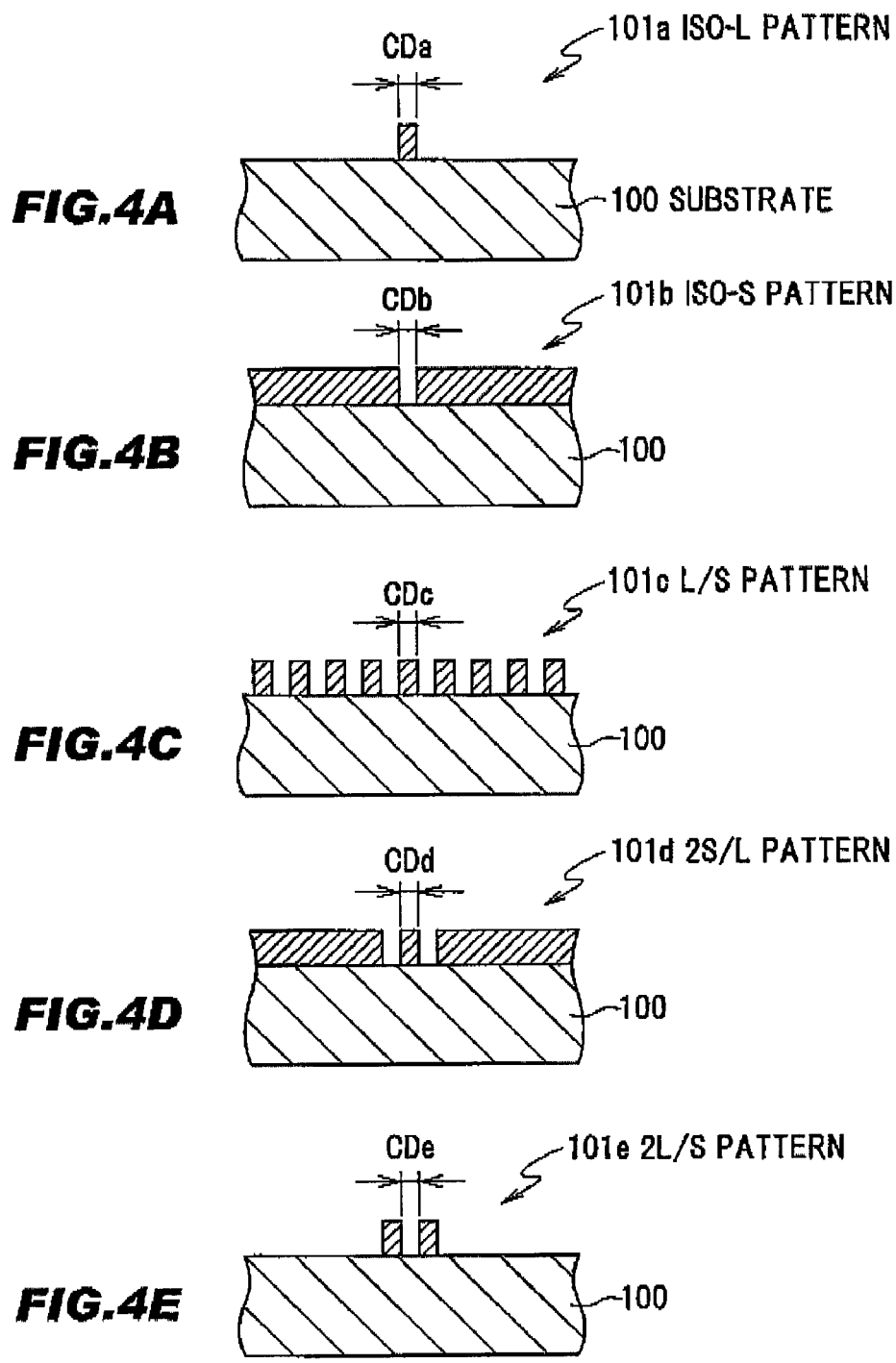

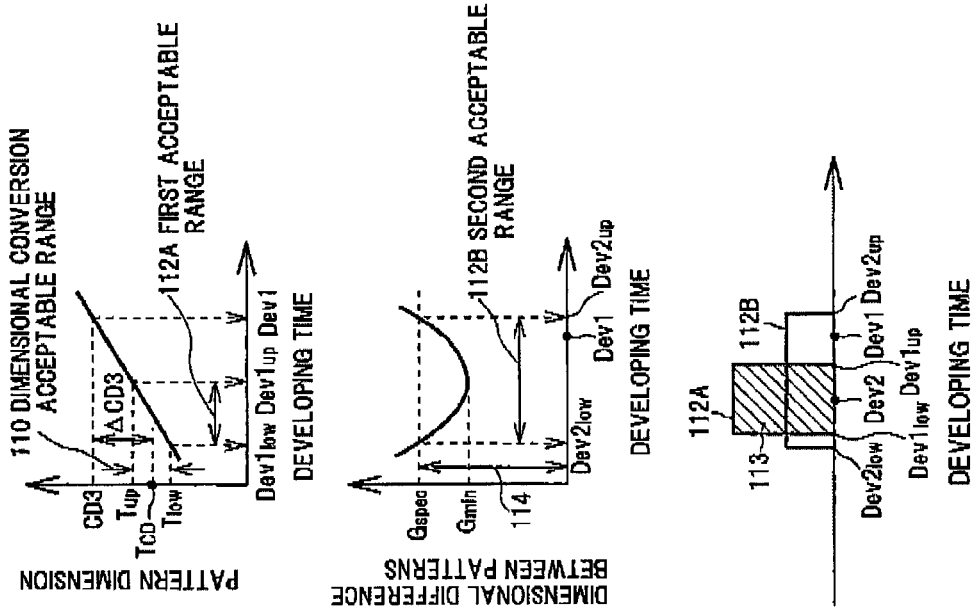
FIG.8C
FIG.8D
FIG.8E
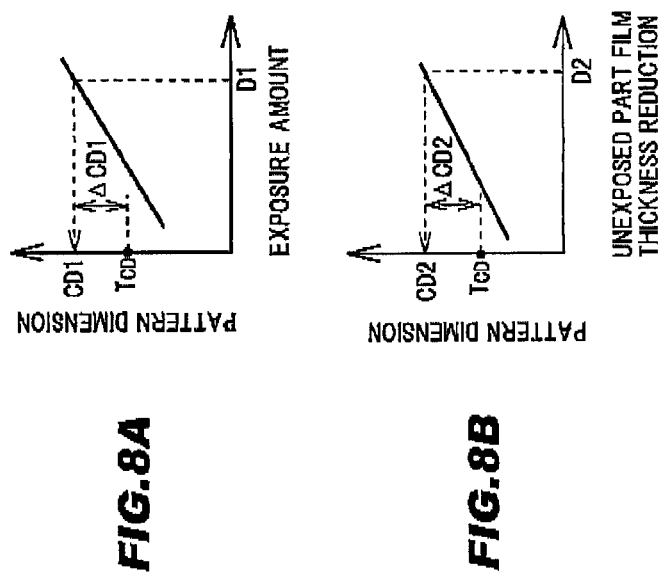
FIG.8A
FIG.8B

FIG.10

| PATTERN DIMENSION / CATEGORY | T-L [nm] | TARGET DIMENSION T | T+L [nm] |
|---|---|---|---|
| U-SHAPE | ⌣ | ⌣ | ⌣ |
| V-SHAPE | ⋁ | ⋁ | ⋁ |
| SQUARE SHAPE | ⊔ | ⊔ | ⊔ |
| SHAPE OF ELLIPSE | ⌣ | ⌣ | ⌣ |

78 MASTER PROFILE INFORMATION

US 8,017,287 B2

DEVELOPMENT METHOD, METHOD OF MANUFACTURING PHOTOMASK, AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2008-299584, filed on Nov. 25, 2008, the entire contents of which are incorporated herein by reference.

BACKGROUND

In a manufacturing process of a photomask or a semiconductor device, a method is widely used that processes such as an exposure, a development and an etching are applied to a photosensitive film formed by coating a substrate with a photosensitive agent, so as to form a desired pattern on the substrate. Particularly, in the development process, it is difficult to control a sensitivity of the photosensitive film, since a sensitivity of the photosensitive agent to a liquid developer is affected by a plurality of factors such as a manufacturing lot when the photosensitive agent is manufactured, a coating environment when the photosensitive agent is coated, and a storage environment of the substrate where the photosensitive film is formed.

Consequently, a technology is proposed that measures stages of progress of the development and controls the development process based on the measurement result. This technology is, for example, disclosed in JP-A-2005-217254.

The development method described in JP-A-2005-217254 includes a process of measuring a film thickness of resist while developing the resist exposed and a process of stopping the development when the film thickness of resist becomes a desired thickness.

However, in order to apply the development method to all of the multiple types of patterns different in a dimension, a shape, an arrangement and the like, it is needed to improve an accuracy of dimension.

BRIEF SUMMARY

A development method according to an embodiment includes exposing a photosensitive film formed on a substrate at a predetermined exposure amount, carrying out a first development process that develops the exposed photosensitive film at a predetermined first development condition so as to leave the photosensitive film, obtaining a sensitivity information of the photosensitive film from a film thickness reduction of the photosensitive film developed by the first development process and the exposure amount, predicting pattern dimensions of multiple types of patterns to be formed when a second development process is carried out following the first development process from the sensitivity information, and determining a first acceptable range of a development condition in the second development process, determining a second acceptable range of the development condition in the second development process from the first acceptable range and a variation amount of the pattern dimension after the development process between the multiple types of patterns and determining a second development condition in the second development process so as to satisfy both of the first and second acceptable ranges.

A method of manufacturing a photomask according to the other embodiment includes determining the second development condition in the second development process by the above-mentioned development method, and then forming a mask pattern by carrying out the second development process at the second development condition.

A method of manufacturing a semiconductor device according to the other embodiment includes forming a pattern on a wafer by using the photomask manufactured by the above-mentioned method of manufacturing a photomask.

A method of manufacturing a development device according to the other embodiment includes a sensitivity information obtaining part for obtaining a sensitivity information of a photosensitive film from a film thickness reduction of the photosensitive film developed by a first development process and an exposure amount, when the first development process that exposes the photosensitive film formed on a substrate at the predetermined exposure amount and develops the exposed photosensitive film at the predetermined first development condition so as to leave the photosensitive film is carried out, a dimension predicting part for predicting pattern dimensions of multiple types of patterns to be formed when a second development process is carried out following the first development process from the sensitivity information, and a development condition determining part for determining a first acceptable range of a development condition in the second development process, determining a second acceptable range of a development condition in the second development process from the first acceptable range and a variation amount of the pattern dimension after the development process between the multiple types of patterns and determining a development condition in the second development process so as to satisfy both of the first and second acceptable ranges.

BRIEF DESCRIPTION OF THE DRAWING

FIG. 1 is a flowchart showing each process of a development method;

FIG. 3A is a graph showing a relationship between an exposure amount and a pattern dimension;

FIG. 3B is a graph showing a relationship between an exposure amount and an exposed part film thickness reduction;

FIG. 3C is a graph showing a relationship between an exposed part film thickness reduction and a pattern dimension;

FIG. 3D is a graph showing a relationship between a developing time and an exposed part film thickness reduction;

FIG. 3E is a graph showing a relationship between a developing time and a dimensional difference between patterns;

FIG. 3F is an explanatory view schematically showing a mutual acceptable range of a developing time;

FIGS. 4A to 4E are cross-sectional views schematically showing respective examples of multiple types of patterns;

FIG. 8A is a graph showing a relationship between an exposed part film thickness reduction and a pattern dimension;

FIG. 8B is a graph showing a relationship between an unexposed part film thickness reduction and a pattern dimension;

FIG. 8C is a graph showing a relationship between a developing time and a pattern dimension;

FIG. 8D is a graph showing a relationship between a developing time and a dimensional difference between patterns;

FIG. 8E is an explanatory view schematically showing a mutual acceptable range of a developing time;

FIG. 10 is an explanatory view schematically showing an example of master profile information;

DETAILED DESCRIPTION

First Embodiment

Development Method

Figure 2A:
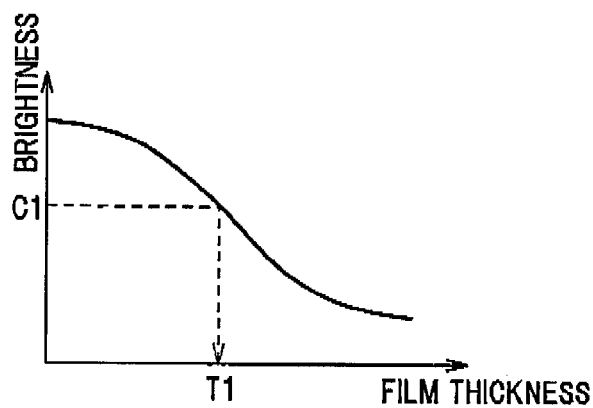
FIG. 2A is a graph showing a relationship between a film thickness of resist and brightness.
Figure 2B:
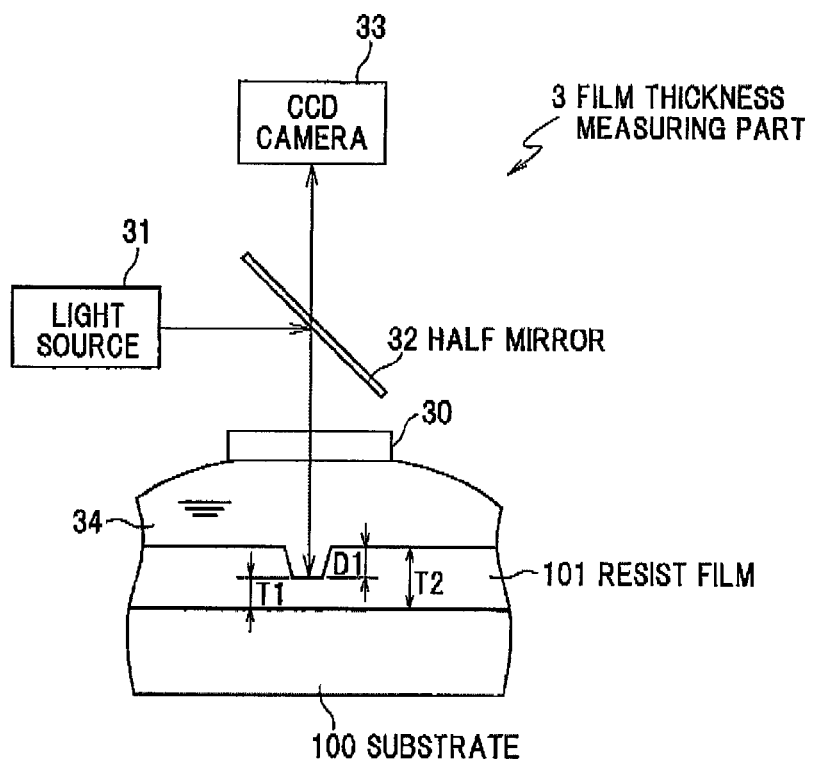
FIG. 2B is an explanatory view schematically showing an example of a structure of a film thickness measuring part.

Hereinafter, a development method according to a first embodiment will be explained in accordance with a flowchart of FIG. 1 and with reference to FIGS. 2A and 2B, FIGS. 3A to 3F and FIGS. 4A to 4E, FIG. 2A is a graph showing a relationship between a film thickness of resist and brightness, FIG. 2B is an explanatory view schematically showing an example of a structure of a film thickness measuring part, FIG. 3A is a graph showing a relationship between an exposure amount and a pattern dimension, FIG. 3B is a graph showing a relationship between an exposure amount and an exposed part film thickness reduction, FIG. 3C is a graph showing a relationship between an exposed part film thickness reduction and a pattern dimension, FIG. 3D is a graph showing a relationship between a developing time and an exposed part film thickness reduction, FIG. 3E is a graph showing a relationship between a developing time and a dimensional difference between patterns, FIG. 3F is an explanatory view schematically showing a mutual acceptable range of a developing time. FIGS. 4A to 4E are cross-sectional views schematically showing respective examples of multiple types of patterns.

Before the start of the film thickness measurement, in order to reduce an influence to the measurement values due to long-term changing factors such as a light source, an optical receiver, a measurement system including the light source and the optical receiver is moved on a calibration plate 103 (refer to FIG. 6) whose surface reflectance is known (it is preferable that the surface thereof is a mirror surface), and brightness of the calibration plate 103 is measured. The brightness obtained by the measurement can be stored as a parameter that corrects brightness obtained in subsequent film thickness measurements in each case. The correction of brightness is generally carried out by using brightness obtained from a brightness calibration parameter prepared by an actual measurement of the film thickness of the resist, however, it can also be carried out by using brightness obtained by multiplying a predetermined coefficient to the brightness obtained from the brightness calibration parameter or by using a difference (offset: brightness obtained from the brightness calibration parameter prepared by an actual measurement of the film thickness of the resist).

First, a resist film (a photosensitive film) is formed on a substrate, and a film thickness of the resist film is obtained by using a relationship between a film thickness of the resist and the above-mentioned corrected brightness (hereinafter simply referred to as brightness) (shown in FIG. 2A) preliminarily obtained (S1). As shown in FIG. 2A, the relationship between the film thickness of the resist and the brightness is configured so as to be capable of uniquely converting brightness information of a pattern for monitor to the film thickness of the resist. Particularly, the relationship between the brightness of the pattern for monitor and the film thickness of the resist when the pattern for monitor is irradiated with a light having a predetermined quantity of light from a light source is dependent on a wavelength of the light source, the film thickness, n (refraction index), and k (extinction coefficient) (n, k are determined uniquely to the wavelength). Consequently, the wavelength of the light source is selected so as to be capable of uniquely converting or a first development condition is selected so as to be capable of uniquely converting in almost the film thickness after the development is carried out at the first development condition described below. Further, the brightness information is obtained, for example, by using a CCD camera shown in FIG. 2B.

Next, after the resist film is exposed at a predetermined condition, a first development process is carried out in accordance with the first development condition (S2). In the embodiment, the first development condition is, for example, a development condition that the film thickness of the exposed part is dissolved so as to be reduced to almost the half, particularly, is a developing time Dev1. Further, the first development condition can be a development condition that the resist film is developed so as to have a predetermined film thickness and an amount of the development is not limited to the half.

Subsequently, the film thickness of the exposed part developed by the first development process is once again obtained by using the relationship between the film thickness and the brightness (shown in FIG. 2A). And, in FIG. 2B, if a film thickness of the resist film before the development process is T1 and a film thickness after the development process is T2, the exposed part film thickness reduction D1 is calculated by obtaining a difference between the film thickness before the development process T1 and the film thickness after the development process T2 as a comparison between T1 and T2 (S3).

Next, the relationship between the exposed part film thickness reduction and the pattern dimension (shown in FIG. 3C) is obtained by using the relationship between the exposure amount preliminarily obtained and the pattern dimension of the exposed part in case of being formed by a criterion developing time (a time of usual development process carried out one time) (shown in FIG. 3A) and the relationship between the exposure amount as the sensitivity information of the photosensitive film and the exposed part film thickness reduction (shown in FIG. 3B), and a final pattern dimension is predicted by using the above-mentioned relationship (shown in FIG. 3C) (S4). For example, in the relationship shown in FIG. 3C, if the film thickness reduction of the resist calculated by the above-mentioned process S3 is D1, the final pattern dimension is predicted to be CD1.

Next, a correction amount for shaping into a desired pattern dimension (hereinafter referred to as "a target dimension") is determined. For example, if the film thickness reduction of the resist measured after the first development process is D1, the pattern dimension predicted is CD1 and the target dimension is $T_{CD}$, a difference between CD1 and $T_{CD}$ becomes a pattern dimension correction amount ΔCD for shaping into the target dimension. Further, if a film thickness reduction corresponding to the target dimension $T_{CD}$ is D2, a difference between D1 and D2 becomes a film thickness reduction correction amount ΔD for shaping into the target dimension.

A development condition correction amount ΔDev is calculated by using the film thickness reduction correction amount ΔD obtained as described above and the relationship between the developing time (development condition) and the exposed part film thickness reduction shown in FIG. 3D. Further, the development condition correction amount ΔDev can be also calculated by using the pattern dimension correction amount ΔCD and the graph showing the relationship between the pattern dimension preliminarily obtained and the developing time.

Actually, as shown in FIG. 3C, an error range acceptable to the target dimension $T_{CD}$ according to a specification of the pattern to be formed is set to a dimensional conversion acceptable range 110. Consequently, a correctable range of the development condition changes according to the dimensional conversion acceptable range 110. The correctable range of the development condition obtained from the dimensional conversion acceptable range 110 is calculated as a first acceptable range 112A corresponding to the film thickness reduction conversion acceptable range 111 by using the relationship shown in FIG. 3D (S5). The first acceptable range 112A is used for controlling an average value of the pattern dimension to be formed within a desired range.

Subsequently, a condition (second acceptable range 112B) according to a difference in coarseness and fineness of the pattern in a local region of the pattern to be formed is calculated (S6). The types of the pattern categories in the local region include, as shown in FIGS. 4A to 4E, ISO-L pattern 101a, ISO-S pattern 101b, L/S (line and space) pattern 101c, 2S/L pattern 101d, and 2L/S pattern 101e. However, the types of the pattern categories are not limited to the examples shown in FIGS. 4A to 4E. Further, set values of the pattern dimensions CDa, CDb, CDc, CDd, CDe of each pattern category can be specified to a fixed value (for example, 100 nm), however, it is preferable that the dimensions are changed, for example, within a range of 50 nm (in case of being fine) to 2000 nm (in case of being wide). ISO-L pattern 101a means a line pattern isolated, ISO-S pattern 101b means a space pattern isolated, L/S (line and space) pattern 101c means a pattern where the line pattern and the space pattern are alternately arranged, 2S/L pattern 101d means a pattern where the space patterns are arranged in both sides of the line pattern and 2L/S pattern 101e means a pattern where the line patterns are arranged in both sides of the space pattern.

In case of the above-mentioned pattern in the local region, the exposure amount, a proximity correction coefficient and the like are determined under the condition that generally, a dimensional difference between the respective pattern categories (hereinafter referred to as "dimensional difference between patterns") is minimized. Further, the dimensional difference between patterns is calculated from, for example, a pattern dimension between at least two types of the pattern categories of the five types of the pattern categories. And, the dimensional difference between patterns can be also, for example, a difference between the minimum and maximum values of dimensional variation in the multiple types of the pattern categories or a statistical value such as standard deviation.

The above-mentioned condition that the dimensional difference between patterns is minimized is defined as a pattern difference in coarseness and fineness correction condition, and the value of the dimensional difference between patterns when the dimensional difference between patterns is minimized by the pattern difference in coarseness and fineness correction condition is defined as a difference between patterns minimum value Gmin as shown in FIG. 3E. Further, an acceptable error range as the dimensional difference between patterns is defined as a difference between patterns acceptable range 114. Here, the difference between patterns acceptable range 114 means a variation amount acceptable to the pattern dimension in the multiple types of patterns in the lithographic technique. Further, the difference between patterns acceptable range 114 is set so as to satisfy lithography likelihood.

The lithography likelihood means a margin of a transfer condition obtained from a plurality of conditions such as the variation amount acceptable to the pattern dimension between the multiple types of patterns in the lithographic technique. For example, in case of a semiconductor device, a dimension acceptable range acceptable to the pattern is preliminarily determined from an operating characteristics and the like after processed to the device. Consequently, the difference between patterns acceptable range 114 is set so as to satisfy the lithography likelihood and the development process is carried out under the development condition where the difference between patterns acceptable range 114 is satisfied, so that the pattern formation where the desired lithography likelihood is ensured can be carried out.

When a sensitivity of the resist film is changed, a variation of the pattern difference in coarseness and fineness correction condition occurs, and according to this, the difference between patterns minimum value Gmin is changed, so that the whole of the graph shown in FIG. 3E shifts in the Y axis direction (in a vertical direction in FIG. 3E) and a range of the development condition where the difference between patterns acceptable range 114 is satisfied is changed. In the embodiment, a correctable range of the development condition where the dimensional difference between patterns becomes less than a difference between patterns acceptable value Gspec which is the maximum value of the difference between patterns acceptable range 114 is defined as a second acceptable range 112B. Further, the second acceptable range 112B can be preliminarily set. In case of being preliminarily set, the process S6 is omitted so as to progress to the process S7.

Next, as shown in FIG. 3F, a mutual acceptable range 113 (shaded area in FIG. 3F) where both of the first acceptable range 112A and the second acceptable range 112B are satisfied is calculated, and a second development condition is determined so as to satisfy the mutual acceptable range 113 (S7). In the embodiment, the second development condition is a condition that at least remaining thickness of the resist film to which the development process is applied under the first development condition is developed, for example, the condition being a developing time Dev2 which is a center value of the mutual acceptable range 113. Further, the second development condition does not necessarily determine a median value of the mutual acceptable range 113 as the development condition, and can be appropriately changed within the mutual acceptable range 113 according to a specification of the pattern to be intended. For example, values at end portions of the mutual acceptable range 113 can be adopted as the second development condition.

And, a second development process is applied to the resist film according to the second development condition determined by the above-mentioned process S7 (S8). As described above, the second development condition is determined so as to satisfy the mutual acceptable range 113, so that a desired lithography likelihood can be ensured, the dimensional difference between the pattern categories can be reduced and the pattern dimension can be controlled with a high degree of accuracy, to the resist film formed on a plurality of the substrates, even if there is a variation in the sensitivity of each resist film.

In the embodiment, an example that the developing time is corrected to a sensitivity change of the photosensitive film (for example, the resist film and the like) has been explained. However, the object of the correction is not limited to the developing time, but a temperature and a concentration of the liquid developer, a liquid speed at the development process, and the combination of these parameters can be also corrected.

Further, in the embodiment, the condition obtained about the sensitivity of the photosensitive film obtained by the first development process can be applied to the third development process and the fourth development process as well as the second development process, in case that a plurality of development processes are successively set. In this case, the respective development conditions are determined so that a sum of the correction amount to the successive plurality of development processes is kept within the mutual acceptable range 113.

Furthermore, in the embodiment, the process of determining the correction condition by obtaining the change amount of the film thickness (film thickness reduction) as the sensitivity information of the photosensitive film has been explained, however, a method that calculates the development condition from a relationship between the dimension and a resist shape information of two-dimension and three-dimension obtained for enhancing the accuracy can be also used. As the method of obtaining the resist shape information of two-dimension and three-dimension, an atomic force microscope (AMF) method or a scatterometoy method can be considered. Further, a developing speed of the photosensitive film and the like can be obtained as the sensitivity information of the photosensitive film.

(Structure of Development Device)

Figure 5A:
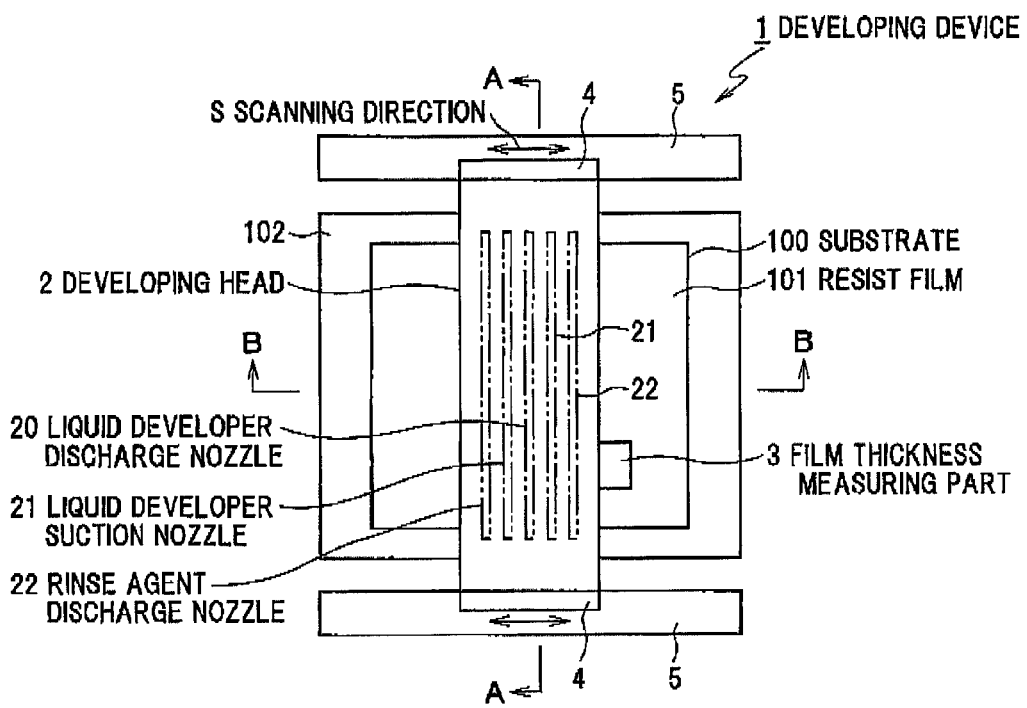
FIG. 5A is a top view schematically showing an example of a structure of a development device.
Figure 5B:
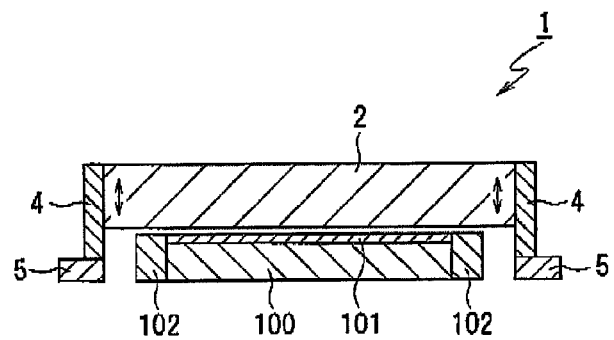
FIG. 5B is a cross-sectional view taken along the line A-A in FIG. 5A.
Figure 6:
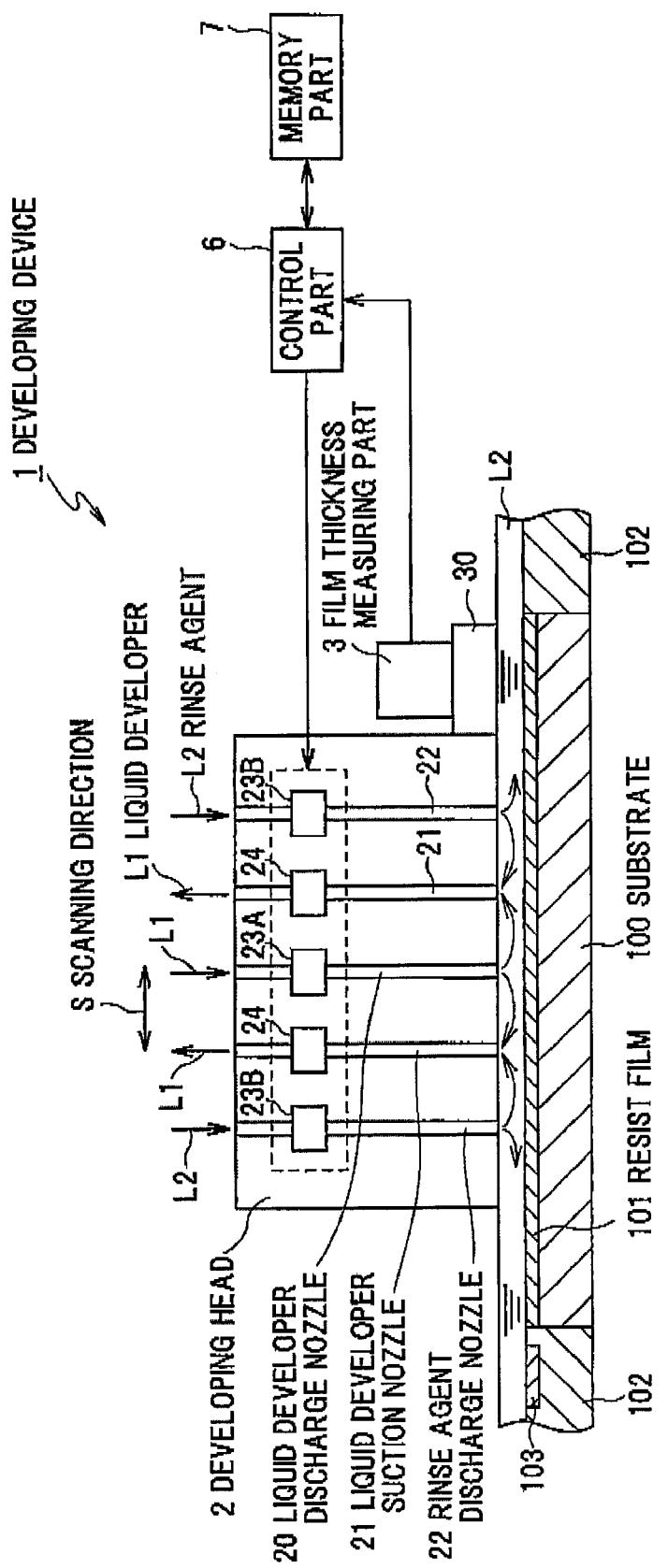
FIG. 6 is a cross-sectional view taken along the line B-B in FIG. 5A.

Next, an example of a development device for carrying out the above-mentioned development method will be explained. FIG. 5A is a top view schematically showing an example of a structure of a development device. FIG. 5B is a cross-sectional view taken along the line A-A in FIG. 5A. FIG. 6 is a cross-sectional view taken along the line B-B in FIG. 5A.

The development device 1 includes a developing head (developing part) 2 for developing a resist film 101 by horizontally moving in a scanning direction S on a substrate 100 while discharging and sucking a liquid developer L1, a film thickness measuring part 3 for measuring a film thickness of the resist film 101, installed in the developing head 2, a gap adjusting mechanism 4 for adjusting a gap between the developing head 2 and the substrate 100 by allowing the developing head 2 to move in a perpendicular direction to a top surface of the substrate 100, a moving mechanism 5 for allowing the developing head 2 to move in the scanning direction S, a control part 6 for determining the development condition based on a measuring result of the film thickness of the resist film 101 by the film thickness measuring part 3 and controlling the developing head 2, the gap adjusting mechanism 4 and the moving mechanism 5, and a memory part 7 where various data are stored.

The substrate 100 is, for example, a transparent substrate such as silica glass or the like, and is kept so that a height of top surface thereof becomes equal to that of an auxiliary plate 102. Further, the top surface of the substrate 100 is coated with a photosensitive agent uniformly, for example, in a thickness of 160 nm, and the resist film 101 where a predetermined pattern is exposed by an exposure device is formed. In the embodiment, a positive type photosensitive agent is used and apart to be developed by a development process is an exposed part exposed by the exposure device. Further, a negative type photosensitive agent can be also used, and in this case, apart to be developed by the development process is an unexposed part not exposed by the exposure device.

(Developing Nozzle)

As shown in FIG. 6, the developing head 2 includes a liquid developer discharge nozzle 20 which is a liquid developer discharging part installed in a center portion of the developing head 2, liquid developer suction nozzles 21 which are liquid developer sucking parts installed in both sides of the liquid developer discharge nozzle 20, and rinse agent discharge nozzles 22 installed in external sides of the liquid developer suction nozzles 21 respectively. Further, in the embodiment, the developing head 2 is horizontally moved by the moving mechanism 5 shown in FIG. 5, and in this case, the developing head 2 and the substrate 100 have only to move relatively, therefore, the substrate 100 can be moved, or both of the developing head 2 and the substrate 100 can be also moved.

The liquid developer discharge nozzle 20, the liquid developer suction nozzle 21 and the rinse agent discharge nozzle 22 have respectively an opening extending in a perpendicular direction to the scanning direction S, in the side of lower surface of the developing head 2, and are arranged along the scanning direction S.

The liquid developer discharge nozzle 20 discharges a liquid developer L1 on the substrate 100 when a solenoid valuve 23A connected to a tank for storing the liquid developer (not shown) is opened under the control of the control part 6. The rinse agent discharge nozzle 22 discharges a rinse agent L2 on the substrate 100 when a solenoid valuve 23B connected to a tank for storing the rinse agent (not shown) is opened under the control of the control part 6. The liquid developer suction nozzle 21 sucks the liquid developer L1 and the rinse agent L2 on the resist film 101 when a pump 24 is driven under the control of the control part 6.

(Film Thickness Measuring Part)

As shown in FIGS. 2B and 6, the film thickness measuring part 3 includes a waterproof cover 30 formed of a transparent material such as acrylic resin and disposed on the resist film 101 via a liquid 34, a light source 31 for irradiating the resist film 101 with a single color light having, for example, a wavelength within a ranged of 600 to 800 nm, a half mirror 32 for reflecting the illuminating light from the light source 31 in the direction of the resist film 101 and transmitting the reflected light reflected by the resist film 101, and a CCD camera 33 for receiving the reflected light reflected by the resist film 101 via the half mirror 32.

The CCD camera 33 measures brightness of the reflected light according to the reflected light received and sends brightness information showing the brightness to the control part 6. The brightness C1 measured by the CCD camera 33 is converted to a film thickness T1 of the resist film 101 by a relationship between the brightness and the film thickness of the resist film shown in FIG. 2A. Further, a beam splitter can be also used instead of the half mirror 32.

(Control System of Development Device)

Figure 7:
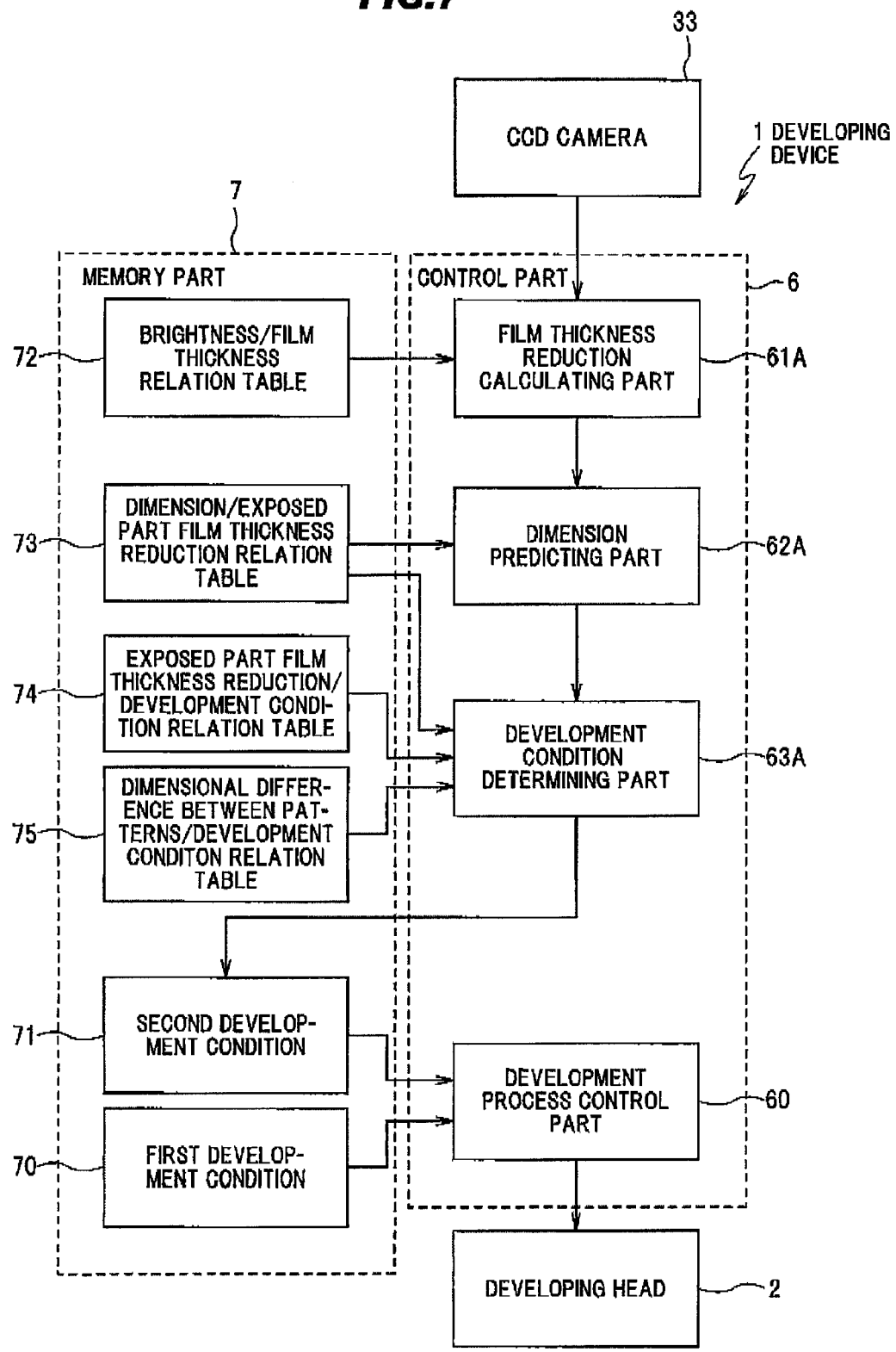
FIG. 7 is a block diagram schematically showing an example of a control system of a development device according to a first embodiment.

FIG. 7 is a block diagram schematically showing an example of a control system of a development device according to a first embodiment. A memory part 7 of the development device 1 stores a first development condition 70, a second development condition 71, a brightness/film thickness relation table 72 corresponding to the relationship between the brightness and the film thickness of the resist film (shown in FIG. 2A), a dimension/exposed part film thickness reduction relation table 73 corresponding to the relationship between the exposed part film thickness reduction and the pattern dimension (shown in FIG. 3C), an exposed part film thickness reduction/development condition relation table 74 corresponding to the relationship between the exposed part film thickness reduction and the developing time (shown in FIG. 3D), a dimensional difference between patterns/development condition relation table 75 corresponding to the relationship between the dimensional difference between patterns and the developing time (shown in FIG. 3E), and a program (not shown) for determining the development condition and controlling the development device 1.

The control part 6 of the development device 1 includes a development process control part 60 as the sensitivity information obtaining part, a film thickness reduction calculating part 61A, a dimension predicting part 62A and a development condition determining part 63A. The control part 6 includes an interface part between a CPU and the memory part 7, and functions as the development process control part 60, film thickness reduction calculating part 61A, dimension predicting part 62A and a development condition determining part 63A by that the CPU operates in accordance with the program stored in the memory part 7. The control part 6 and the memory part 7 can be realized by, for example, a computer.

Further, each of the relation tables 72 to 75 has only to satisfy a condition that numeric values at the horizontal axis and the vertical axis in each of the corresponding graphs are uniquely determined, and for example, the numeric values at the horizontal axis and the vertical axis can be stored by a tabular form, or can be represented by a function such as a polynomial expression. Further, the dimension/exposed part film thickness reduction relation table 73, the exposed part film thickness reduction/development condition relation table 74 and the dimensional difference between patterns/development condition relation table 75 can be information prepared based on a measurement result preliminarily measured by using a sample substrate, or can be also information prepared based on characteristics which the resist film 101 has.

(Development Process Control Part)

The development process control part 60 controls the developing head 2, the gap adjusting mechanism 4, the moving mechanism 5 and the like according to the first and second development conditions 70, 71 so as to carry out the first and second development processes.

(Film Thickness Reduction Calculating Part)

The film thickness reduction calculating part 61A obtains a film thickness corresponding to the brightness information of the exposed part of the resist film 101 measured by the CCD camera 33 with reference to the brightness/film thickness relation table 72, and calculates a film thickness reduction D1 of the exposes part as the brightness information of the resist film 101 from a reduction state of the film thickness before and after the development process.

(Dimension Predicting Part)

The dimension predicting part 62A predicts a final pattern dimension CD1 when the second development process is carried out from the film thickness reduction D1 calculated by the film thickness reduction calculating part 61A with reference to the dimension/exposed part film thickness reduction relation table 73.

(Development Condition Determining Part)

The development condition determining part 63A obtains the dimensional conversion acceptable range 110 to be acceptable from the target dimension $T_{CD}$. The dimensional conversion acceptable range 110 is, as shown in FIG. 3C, a range enclosed with a lower limit dimension Tlow and an upper limit dimension Tup being an upper limit.

And, the development condition determining part 63A obtains the film thickness reduction conversion acceptable range 111 from the dimensional conversion acceptable range 110 with reference to the dimension/exposed part film thickness reduction relation table 73. The film thickness reduction conversion acceptable range 111 is, as shown in FIG. 3C, a range enclosed with a lower limit film thickness reduction Dlow corresponding to the lower limit dimension Tlow and an upper limit film thickness reduction Dup corresponding to the upper limit dimension Tup.

Next, the development condition determining part 63A calculates the first acceptable range 112A from the film thickness reduction conversion acceptable range 111 with reference to the exposed part film thickness reduction/development condition relation table 74. The first acceptable range 112A is, as shown in FIG. 3D, a range enclosed with a development condition Devellow corresponding to the lower limit film thickness reduction Dlow and a development condition Develup corresponding to the upper limit film thickness reduction Dup.

Next, the development condition determining part 63A calculates, as shown in FIG. 3E, the second acceptable range 112B enclosed with a development condition Dev2low determined from the difference between patterns acceptable value Gspec and a development condition Dev2up with reference to the dimensional difference between patterns/development condition relation table 75.

And, the development condition determining part 63A calculates, as shown in FIG. 3F, the mutual acceptable range 113 so as to satisfy both of the first acceptable range 112A and the second acceptable range 112B, and determines a development condition Dev2 included in the mutual acceptable range 113 as the second development condition.

Advantages of First Embodiment

According to the first embodiment, the desired lithography likelihood can be ensured, the dimensional difference between the pattern categories can be reduced and the pattern dimension can be controlled with a high degree of accuracy, even if there is a variation in the sensitivity of each resist film formed on a plurality of the substrates.

Second Embodiment

Hereinafter, a development method according to a second embodiment will be explained with reference to FIGS. 2A and 2B, FIGS. 3A to 3F, and FIGS. 8A to 8E. FIG. 8A is a graph showing a relationship between an exposed part film thickness reduction and a pattern dimension, FIG. 8B is a graph showing a relationship between an unexposed part film thickness reduction and a pattern dimension, FIG. 8C is a graph showing a relationship between a developing time and a pattern dimension, FIG. 8D is a graph showing a relationship between a developing time and a dimensional difference between patterns, and FIG. 8E is an explanatory view schematically showing a mutual acceptable range of a developing time. The embodiment involves as a measuring object not only the film thickness of the exposed part of the resist film, but also the film thickness of the unexposed part.

It has been obtained as knowledge based on an experiment etc. of the inventors and the like that the film thickness reduction is caused in not only the exposed part but also the unexposed part of the resist film when the development process is carried out. Since it is considered that the film thickness of the resist film in the unexposed part is isotropically-reduced, it can be considered that the film thickness reduction of the unexposed part and the change amount of the pattern dimension correspond to each other. Consequently, the second development condition or the following development conditions is (or are) determined in consideration of the film thickness reduction of the unexposed part, so that the pattern dimension can be controlled with a higher degree of accuracy.

First, a resist film is formed on a substrate, and a film thickness of the resist film is obtained by using a relationship between a film thickness of the resist and brightness (shown in FIG. 2A). Next, after the resist film is exposed at a predetermined condition, a first development process is carried out in accordance with the first development condition.

Subsequently, the film thickness of the exposed part and the unexposed part developed by the first development process is obtained by using the relationship shown in FIG. 2A, and the exposed part and the unexposed part film thickness reductions D1, D2 are calculated by obtaining a difference between the film thickness before the development process and the film thickness after the development process as a comparison of the film thicknesses.

Next, the pattern dimension CD1 is predicted from the exposed part film thickness reductions D1 by using the relationship between the exposed part film thickness reduction and the pattern dimension (shown in FIG. 9A) similar to the relationship shown in FIG. 3C obtained from the relationship shown in FIG. 3A and the relationship shown in FIG. 3B. Further, the pattern dimension CD2 is predicted from the unexposed part film thickness reductions D2 by using the relationship between the unexposed part film thickness reduction and the pattern dimension (shown in FIG. 8B).

Next, a first pattern dimension correction amount ΔCD1 which is a difference between the pattern dimension CD1 and the target dimension $T_{CD}$ is calculated, and a second pattern dimension correction amount ΔCD2 which is a difference between the pattern dimension CD2 and the target dimension $T_{CD}$ is calculated. And, a final pattern dimension correction amount ΔCD3 is calculated by adding the second pattern dimension correction amount ΔCD2 to the first pattern dimension correction amount ΔCD. Further, the final pattern dimension correction amount ΔCD3 can be calculated by adding or subtracting the second pattern dimension correction amount ΔCD2 to or from the first pattern dimension correction amount ΔCD1, or by adding or subtracting the second pattern dimension correction amount ΔCD2 multiplied by a predetermined coefficient to or from the first pattern dimension correction amount ΔCD1.

Next, a dimensional conversion acceptable range 110 acceptable from the target dimension $T_{CD}$ is calculated by using the relationship between the pattern dimension and the developing time preliminarily obtained (shown in FIG. 8C). Subsequently, a first acceptable range 112A is calculated from the dimensional conversion acceptable range 110 by using the relationship between the pattern dimension and the developing time (shown in FIG. 8C).

Next, a second acceptable range 112B determined from a difference between patterns acceptable value Gspec is calculated by using the relationship between the dimensional difference between patterns and the developing time (shown in FIG. 8D).

Next, a mutual acceptable range 113 (shaded area in FIG. 8E) where both of the first acceptable range 112A and the second acceptable range 112B are satisfied is calculated, and a development condition Dev2 is determined as a second development condition 71 so as to satisfy the mutual acceptable range 113. And, a second development process is applied to the resist film according to the second development condition determined as described above.

(Structure of Development Device)

Figure 9:
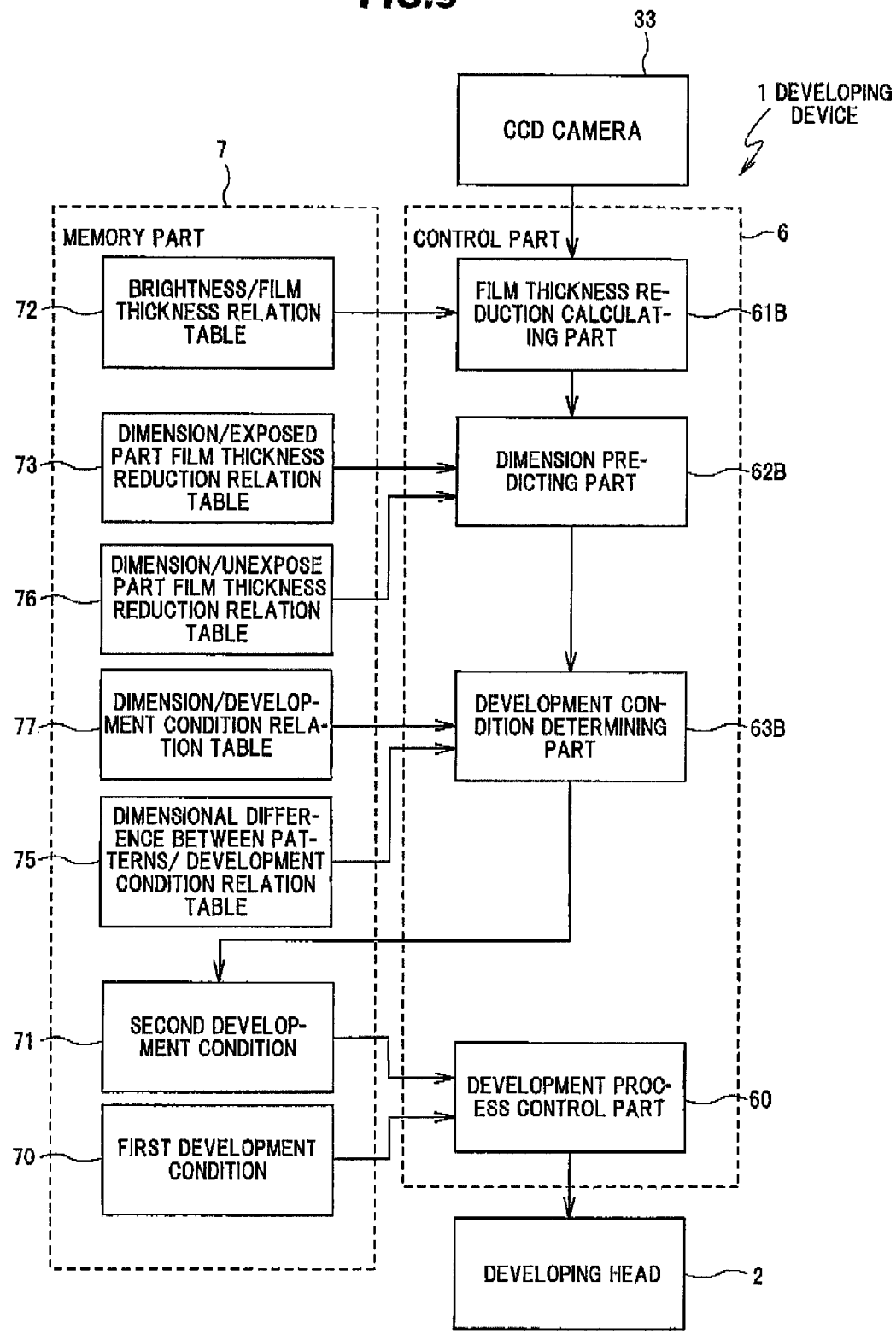
FIG. 9 is a block diagram schematically showing an example of a control system of a development device according to a second embodiment.

Next, an example of a development device for carrying out the above-mentioned development method will be explained. FIG. 9 is a block diagram schematically showing an example of a control system of a development device according to a second embodiment.

The development device 1 includes a film thickness measuring part 3, a control part 6 and a memory part 7, and includes a developing head 2, a gap adjusting mechanism 4 and a moving mechanism 5 similar to the first embodiment.

The film thickness measuring part 3 measures the film thickness of not only the exposed part of the resist film but also the unexposed part adjacent to the exposed part.

The memory part 7 stores a first development condition 70, a second development condition 71, a brightness/film thickness relation table 72 similar to the first embodiment, and stores a dimension/exposed part film thickness reduction relation table 73 corresponding to the relationship shown in FIG. 8A, a dimension/unexposed part film thickness reduction relation table 76 corresponding to the relationship shown in FIG. 8B, a dimension/development condition relation table 77 corresponding to the relationship shown in FIG. 8C, and a dimensional difference between patterns/development condition relation table 75 corresponding to the relationship shown in FIG. 8D.

The control part 6 includes a development process control part 60 similar to the first embodiment, and further includes a film thickness reduction calculating part 61B as the sensitivity information obtaining part for calculating film thickness reductions of the exposed part and the unexposed part of the resist film, a dimension predicting part 62B for predicting a final pattern dimension from the film thickness reductions of the exposed part and the unexposed part, and a development condition determining part 63B for determining the second development condition 71 so as to keep within the mutual acceptable range which satisfies both of the first acceptable range 112A and the second acceptable range 112B.

Advantages of Second Embodiment

According to the second embodiment, the sensitivity information of the photosensitive film is obtained from not only the film thickness reduction of the exposed part but also the film thickness reduction of the unexposed part, so that the pattern dimension can be controlled with a higher degree of accuracy in comparison with the first embodiment.

Third Embodiment

Hereinafter, a development method according to a third embodiment will be explained with reference to FIG. 10. FIG. 10 is an explanatory view schematically showing an example of master profile information. In the master profile information 78, multiple pieces of profile information as the sensitivity information of the photosensitive film are stored in a state of being classified in categories of the two-dimensional shape in the depth direction. The categories include, as shown in FIG. 10, a U-shape, a V-shape, a square shape (concave shape), and a shape of ellipse. Further, in a single category, the multiple pieces of profile information in case of changing the exposing amount are stored at L nm (for example, 0.2 nm) intervals centering around the target dimension in the width direction. In the embodiment, the pattern dimension is obtained from the two-dimensional shape (category and largeness) of the exposed part of the resist film by using the master profile information 78. A table associating the profile information with the pattern dimension shown in FIG. 10 is prepared.

First, a resist film is formed on a substrate, and after the resist film is exposed at a predetermined condition, a first development process is carried out according to a first development condition.

Next, the two-dimensional shape of the exposed part developed by the first development process is measured, and a category similar to the two-dimensional shape measured is detected by the master profile information 78. Further, as a method of determining the profile information to which the two-dimensional shape is similar, a pattern matching or the like can be used.

Next, the profile information having a near two-dimensional shape measured, of the profile information in the similar category, is obtained and the pattern dimension is predicted from the profile information.

After that, a process of calculating the first and second acceptable ranges by using the predicted pattern dimension, a process of determining the second development condition so as to satisfy the mutual acceptable range, and a process of carrying out the second development process according to the second development condition are similar to the first embodiment so that an explanation will be omitted.

(Structure of Development Device)

Figure 11:
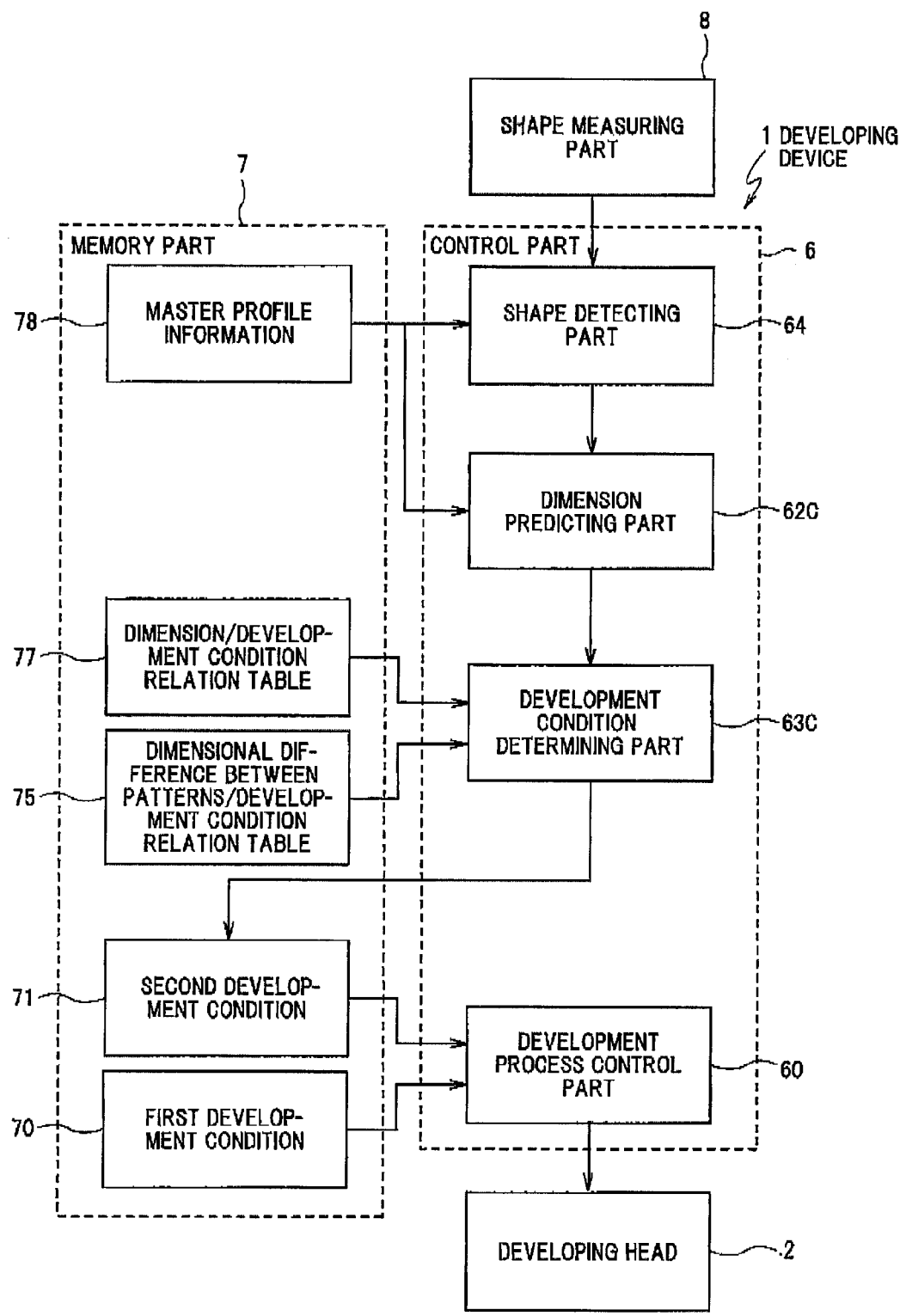
FIG. 11 is a block diagram schematically showing an example of a control system of a development device according to a third embodiment.

Next, an example of a development device for carrying out the above-mentioned development method will be explained. FIG. 11 is a block diagram schematically showing an example of a control system of a development device according to a third embodiment.

The development device 1 includes, a shape measuring part 8 for measuring a two-dimensional shape of a resist film 101 instead of the film thickness measuring part 3, a control part 6, and a memory part 7, and includes a developing head 2, a gap adjusting mechanism 4, a moving mechanism 5 and the like similar to the first embodiment.

The shape measuring part 8 is installed in the developing head 2, and is formed to have a part capable of measuring the two-dimensional shape of the resist film 101 such as an AFM, a scatterometry for receiving a diffracted light of an oblique-incidence light and the like. Further, the shape measuring part 8 can be also formed so as to measure a three-dimensional shape of the resist film 101.

The memory part 7 stores a master profile information 78 corresponding to FIG. 10, a first development condition 70, a second development condition 71 and a dimensional difference between patterns/development condition relation table similar to the first embodiment, and a dimension/development condition relation table 77 similar to the second embodiment.

The control part 6 includes a development process control part 60 similar to the first embodiment, and further includes a shape detecting part 64 as the sensitivity information obtaining part for detecting a two-dimensional shape (category and largeness) of the exposed part of the resist film 101, a dimension predicting part 62C for predicting a pattern dimension based on the two-dimensional shape of the exposed part, and a development condition determining part 63C for determining the second development condition 71 so as to keep within the mutual acceptable range which satisfies both of the first acceptable range 112A and the second acceptable range 112B.

The shape detecting part 64 receives the two-dimensional shape of the exposed part of the resist film 101 measured by the shape measuring part 8, refers to the master profile information 78, and detects a category where the profile information similar to the two-dimensional shape received is stored.

The dimension predicting part 62C refers to the master profile information 78 of a category detected by the shape detecting part 64, obtains the profile information having a neat shape in a thickness direction, namely, a near film thickness reduction in the two-dimensional shape measured by the shape measuring part 8, and predicts the pattern dimension from the profile information.

Advantages of Third Embodiment

According to the third embodiment, the development condition is determined from the two-dimensional shape when the exposed part is developed halfway, so that the pattern dimension can be controlled with a higher degree of accuracy in comparison with the first embodiment, in addition to the advantages of the first embodiment.

Fourth Embodiment

Hereinafter, a development method according to a fourth embodiment will be explained. The embodiment calculates a film thickness reduction from the two-dimensional shape of the exposed part of the resist film by using the master profile information 78 and simultaneously calculates a film thickness reduction of the unexposed part from the graph between the brightness and the film thickness of the resist film, and determines the second development condition or the following development conditions in consideration of the film thickness reduction of the unexposed part.

First, a resist film is formed on a substrate, and a film thickness of the resist film is obtained. Next, after the resist film is exposed at a predetermined condition, a first development process is carried out according to a first development condition.

Next, the two-dimensional shape of the exposed part developed by the first development process is measured, and a category similar to the two-dimensional shape measured is detected by the master profile information 78.

Subsequently, the film thickness of the unexposed part developed by the first development process is obtained, and the unexposed part film thickness reduction is calculated by obtaining a difference from the film thickness before the resist film is developed.

Next, the profile information having a near film thickness reduction of the two-dimensional shape measured, of the profile information in the similar category, is obtained and the first pattern dimension is predicted from the profile information. And, the second pattern dimension is predicted from the film thickness reduction D2 of the unexposed part.

Next, a first pattern dimension correction amount which is a difference between the first pattern dimension predicted and the target dimension is calculated, and a second pattern dimension correction amount which is a difference between the second pattern dimension predicted and the target dimension is calculated. And, a final pattern dimension correction amount is calculated from the first and second pattern dimension correction amounts, similarly to the second embodiment.

After that, a process of calculating the first and second acceptable ranges by using the pattern dimension correction amount, a process of determining the second development condition so as to satisfy the mutual acceptable range, and a process of carrying out the second development process according to the second development condition are similar to the second embodiment so that an explanation will be omitted.

(Structure of Development Device)

Figure 12:
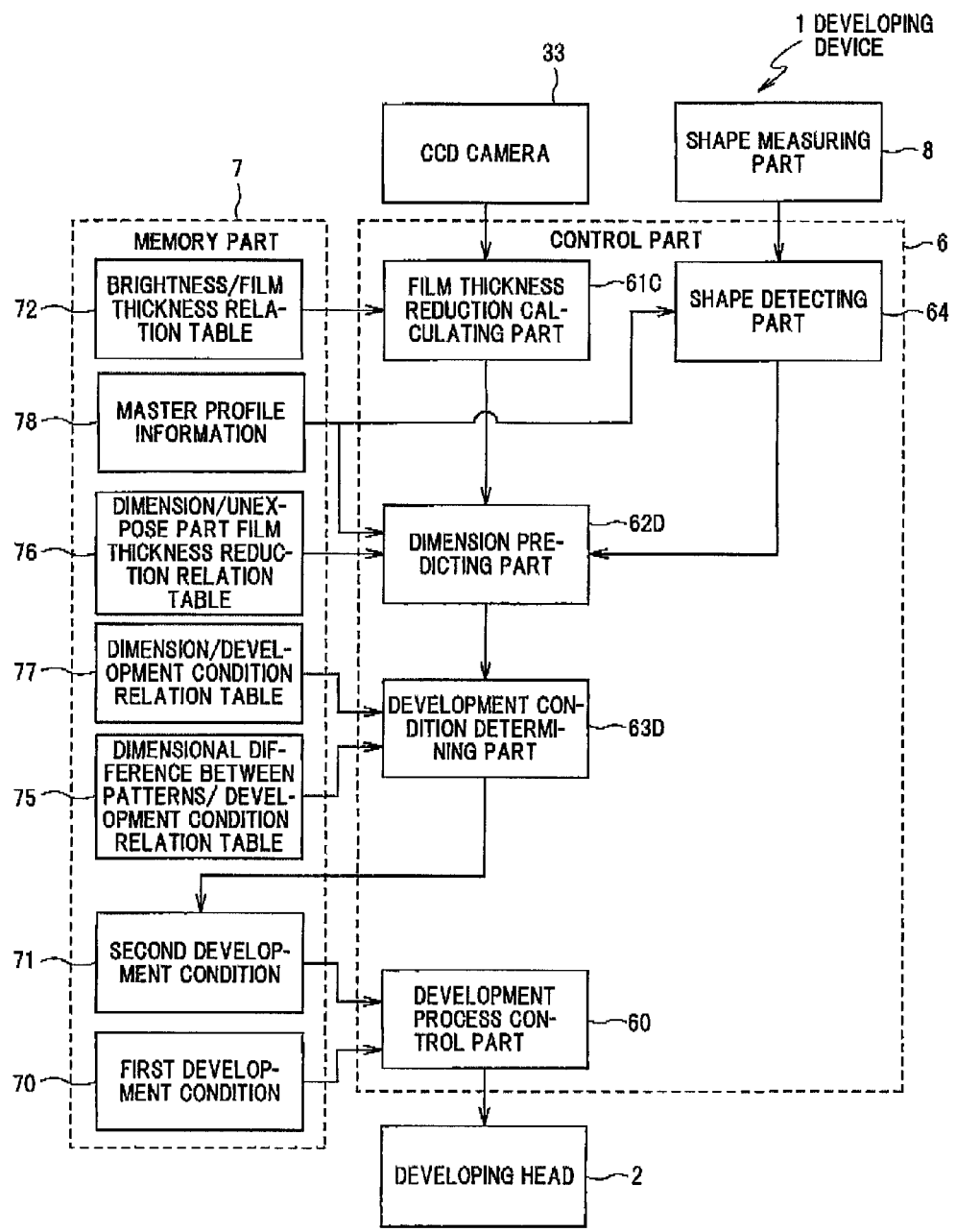
FIG. 12 is a block diagram schematically showing an example of a control system of a development device according to a fourth embodiment.

Next, an example of a development device for carrying out the above-mentioned development method will be explained. FIG. 12 is a block diagram schematically showing an example of a control system of a development device according to a fourth embodiment.

The development device 1 includes a film thickness measuring part 3 for measuring a film thickness of an unexposed part of a resist film 101, a shape measuring part 8 for measuring a two-dimensional shape of the exposed part of the resist film 101, a control part 6 and a memory part 7, and includes a developing head 2, a gap adjusting mechanism 4, a moving mechanism 5 and the like similar to the first embodiment.

The memory part 7 stores a first development condition 70, a second development condition 71, and a dimensional difference between patterns/development condition relation table 75 similar to the first embodiment, further stores a dimension/development condition relation table 77 similar to the second embodiment, and furthermore stores a master profile information 78 similar to the third embodiment.

The control part 6 includes a development process control part 60 similar to the first embodiment and a shape detecting part 64 similar to the third embodiment, and further includes a film thickness reduction calculating part 61C for calculating a film thickness reduction of the unexposed part of the resist film 101, a dimension predicting part 62D for predicting a pattern dimension from the two-dimensional shape of the exposed part and the film thickness reduction of the unexposed part, and a development condition determining part 63D for determining the second development condition 71 so as to keep within the mutual acceptable range which satisfies both of the first acceptable range 112A and the second acceptable range 112B.

Advantages of Fourth Embodiment

According to the fourth embodiment, the film thickness reduction of the unexposed part is considered in addition to the two-dimensional shape when the exposed part is developed halfway, so that the pattern dimension can be controlled with a higher degree of accuracy in comparison with the third embodiment, in addition to the advantages of the third embodiment.

Fifth Embodiment

A fifth embodiment is a method of manufacturing a photomask to which the development methods according to the first to fourth embodiments are applied, Namely, a development process is carried out to a resist film on a substrate by the development methods according to the first to fourth embodiments, and processes of an etching, an elimination of resist and the like are carried out to the resist film after the development process, so that the photomask is manufactured. After the photomask is manufactured, the mask pattern of the photomask is transferred onto the photoresist on the semiconductor wafer, the photoresist is developed so as to form a photoresist pattern, and an etching is carried out by using the photoresist pattern as a mask so as to form a pattern on the semiconductor wafer. By repeating these operations, the semiconductor can be manufactured.

Since in a process of manufacturing a semiconductor device, a plurality of chips are cut out from a wafer, it is needed that a pattern dimension satisfies a target dimension with respect to each chip. On the other hand, in a process of manufacturing a photomask, it is needed that a pattern dimension is formed in accordance with the target dimension and with uniformity with respect to the whole of the patterns to be formed on the substrate, so that if the present invention is applied to a process of manufacturing a photomask, much further advantages can be expected.

Further, the photomask is generally drawn by an electron beam (EB) exposure and a time required to carryout a development process is shorter in comparison with a time required to carry out the exposure process by the EB exposure. Consequently, even if a process time required to carry out the development process is lengthened by that a plurality of the development processes are carried out, the development process does not become a bottleneck, and a turn around time is less affected by it.

Sixth Embodiment

After the resist film is exposed at a predetermined condition, a first development process is carried out to some regions of the resist film in accordance with the first development condition. The substrate 100 includes a main pattern part and a monitor pattern, but a region to which the first development process is carried out is limited to only the monitor pattern. The first and second acceptable ranges are determined from the film thickness reduction of the monitor pattern after the first development process in the same manner as the first embodiment, a development condition correction amount is calculated from the first and second acceptable ranges, and a condition of a second development process is determined. After that, to the region (monitor pattern) to which the first development process is carried out, only the second development process is applied, and to the region (main pattern) to which the first development process is not carried out, the process is carried out for the condition (time) that the second development condition is added to the first development condition.

As shown in the first embodiment, if the first development process is carried out to a region of the whole surface of the substrate, development processes after the second development process may be carried out to the whole surface of the substrate, and if a region to which the first development process is carried out is limited to a part of the substrate (for example, the monitor pattern), it is included in the invention that the development processes are carried out at a development condition that the development is carried to the main pattern (the region to which the first development process is not carried out) at the condition that the second development condition is added to the first development condition, and the development is carried out to the monitor pattern at the condition that at least the exposed part is perfectly molten (the condition is not limited to one).

Further, it should be noted that the present invention is not intended to be limited to the above-mentioned embodiments and modification, and the various kinds of changes thereof can be implemented by those skilled in the art without departing from the gist of the invention. For example, the program stored in the memory part 7 can be provided to the control part 6 via a recording media such as a CD-ROM, and can be also provided to the control part 6 via a network such as the internet.

Further, a part or the whole of the development process control part, the film thickness reduction calculating part, the dimension predicting part, the development condition determining part and the shape detecting part which are included in the control part 6 can be realized by a hardware.

Furthermore, the film thickness measuring part 3 and the shape measuring part 8 can be installed in a movable arm which operates independently from the developing head 2.

What is claimed is:

1. A development method, comprising:
   exposing a photosensitive film formed on a substrate at a predetermined exposure amount;
   carrying out a first development process that develops the exposed photosensitive film at a predetermined first development condition so as to leave an unexposed photosensitive on the substrate film;
   obtaining a sensitivity information of the photosensitive film from a film thickness reduction of the photosensitive film developed by the first development process and the predetermined exposure amount;
   predicting pattern dimensions of multiple types of patterns to be formed when a second development process is carried out following the first development process from the sensitivity information, and determining a first acceptable range of a development condition in the second development process;
   determining a second acceptable range of the development condition in the second development process from the first acceptable range and a variation amount of pattern dimensions between the multiple types of patterns after the second development process ; and
   determining a second development condition in the second development process so as to satisfy both of the first and second acceptable ranges.

2. The development method according to claim 1, wherein the sensitivity information of the photosensitive film is obtained as a first relationship between an exposure amount and an exposed part film thickness reduction that is obtained by measuring a brightness respectively by irradiating the photosensitive film with a light before and after exposing the photosensitive film, and obtaining the exposed part film thickness reduction in the exposed places of the photosensitive film from a difference in the brightness.

3. The development method according to claim 1, wherein the first development process is carried out on some regions of the photosensitive film, and the second development process is carried out so as to develop the some regions of the photosensitive film where the first development process is carried out at the second development condition and so as to develop regions other than the some regions of the photosensitive film at a development condition so that the second development condition is added to the first development condition.

4. The development method according to claim 1, wherein the pattern dimensions are predicted by using a fourth relationship between the pattern dimensions and second an exposed part film thickness reduction, obtained from a second relationship between the pattern dimensions and the predetermined exposure amount and a third relationship between the exposed part film thickness reduction of the photosensitive film and the predetermined exposure amount.

5. The development method according to claim 1, wherein the pattern dimensions are is predicted based on checking a measurement result obtained by measuring a two-dimensional shape in a depth direction of an exposed part of the photosensitive film developed due to the first development process against multiple pieces of profile information having different depths with respect to each of multiple types of categories preliminarily obtained.

6. The development method according to claim 1, wherein the pattern dimensions predicted are CD values.

7. The development method according to claim 1, wherein the pattern dimensions predicted include two-dimensional or three-dimensional shape information.

8. The development method according to claim 1, wherein the development condition in the second development process is a developing time.

9. The development method according to claim 1, wherein the first acceptable range is determined based on an acceptable range obtained by converting an error range acceptable to a target dimensions to be a target of the pattern dimension predicted into the film thickness reduction and a fifth relationship between an exposed part film thickness reduction and the development condition in the second development process.

10. The development method according to claim 1, wherein the second acceptable range is determined so as to satisfy a desired lithography margin for pattern transfer into the photosensitive film.

11. The development method according to claim 10, wherein the second acceptable range is determined so as to include a minimum value of a variation amount of the pattern dimensions.

12. The development method according to claim 1, wherein when plural development processes follow the second development process, respective development conditions in the plural development processes are determined so as to keep a sum of correction amounts to the plural development processes following the second development process within both of the first acceptable range and the second acceptable range.

13. The development method according to claim 1, wherein the first and second development processes are carried out by allowing a developing part having a liquid developer discharge part and a liquid developer suction part to horizontally move relatively to the substrate, and simultaneously, discharging the liquid developer from the liquid developer discharge part onto the photosensitive film and sucking the liquid developer on the photosensitive film at the liquid developer suction part.

14. The development method according to claim 1, wherein the first acceptable range is determined by predicting the pattern dimensions of the multiple types of patterns formed when the second development process is carried out following the first development process, based on the sensitivity information and an unexposed part film thickness reduction obtained by comparing the film thicknesses of the unexposed part of the photosensitive film before and after the first development process.

15. The development method according to claim 14, wherein second development process is further carried out in accordance with the development condition in the second development process.

16. The development method according to claim 14, wherein the first and second development processes are carried out by allowing a developing part having a liquid developer discharge part and a liquid developer suction part to horizontally move relatively to the substrate, and simultaneously, discharging the liquid developer from the liquid developer discharge part onto the photosensitive film and sucking the liquid developer on the photosensitive film at the liquid developer suction part.

17. The development method according to claim 1, wherein the first acceptable range is determined by measuring a two-dimensional shape in a depth direction of an exposed part of the photosensitive film developed by the first development process, obtaining a first pattern dimension based on checking the measurement result of the two-dimensional shape against multiple pieces of profile information, each having a different depth with respect to each of multiple types of categories preliminarily obtained, comparing the film thicknesses of the unexposed part of the photosensitive film before and after the first development process, obtaining an unexposed part film thickness reduction, obtaining a second pattern dimension from an unexposed part film thickness reduction and being based on the first and second pattern dimensions and a target dimension to be a target.

18. A method of manufacturing a photomask, comprising:
    determining the second development condition in the second development process by the development method according to claim 1, and then
    forming a mask pattern by carrying out the second development process at the second development condition.

19. A method of manufacturing a semiconductor device, comprising:
    forming a pattern on a wafer by using the photomask manufactured by the method of manufacturing a photomask according to claim 18.

* * * * *